United States Patent
Wang

(10) Patent No.: US 8,178,156 B2
(45) Date of Patent: May 15, 2012

(54) SURFACE TREATMENT PROCESS FOR CIRCUIT BOARD

(75) Inventor: Chien-Hao Wang, Hsinchu County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 605 days.

(21) Appl. No.: 12/352,228

(22) Filed: Jan. 12, 2009

(65) Prior Publication Data

US 2009/0191329 A1 Jul. 30, 2009

(30) Foreign Application Priority Data

Jan. 30, 2008 (TW) .............................. 97103477 A

(51) Int. Cl.
- B05D 5/12 (2006.01)
- B28B 19/00 (2006.01)
- C23C 18/00 (2006.01)
- B23K 31/00 (2006.01)
- H01L 21/31 (2006.01)

(52) U.S. Cl. ..................... 427/98.5; 427/96.1; 427/96.2; 427/97.3; 427/98.4; 427/99.5; 228/180.1; 228/180.21; 228/180.22; 228/214; 228/215; 438/104; 438/758; 438/760; 438/761

(58) Field of Classification Search ................. 427/96.1, 427/96.2, 97.3, 98.4, 98.5, 99.5; 228/214, 228/215, 180.1, 180.21, 180.22; 438/104, 438/758, 760, 761
See application file for complete search history.

(56) References Cited

U.S. PATENT DOCUMENTS

| | | | | |
|---|---|---|---|---|
| 4,735,694 A | * | 4/1988 | Kukanskis | 205/126 |
| 4,804,615 A | * | 2/1989 | Larson et al. | 430/314 |
| 5,501,350 A | * | 3/1996 | Yoshida et al. | 216/20 |
| 2005/0032273 A1 | * | 2/2005 | Chang et al. | 438/108 |
| 2006/0030069 A1 | * | 2/2006 | Chang | 438/106 |
| 2007/0190686 A1 | * | 8/2007 | Wang | 438/106 |
| 2008/0142254 A1 | * | 6/2008 | Wang et al. | 174/259 |
| 2009/0191329 A1 | * | 7/2009 | Wang | 427/96.2 |

* cited by examiner

*Primary Examiner* — Christina Johnson
*Assistant Examiner* — Atul P Khare
(74) *Attorney, Agent, or Firm* — J.C. Patents

(57) ABSTRACT

A surface treatment process for a circuit board is provided. The circuit board includes a substrate, a first circuit layer disposed on an upper surface of the substrate, and a second circuit layer disposed on a lower surface of the substrate. The first circuit layer is electrically connected to the second circuit layer. In the surface treatment process for the circuit board, a first oxidation protection layer and a second oxidation protection layer are respectively formed on a portion of the first circuit layer and a portion of the second circuit layer by immersion. Afterwards, the first circuit layer exposed by the first oxidation protection layer is subjected to black oxidation to form a black oxide layer. The thickness of the first oxidation protection layer is thinner than or equal to the thickness of the black oxide layer.

7 Claims, 4 Drawing Sheets

SURFACE TREATMENT PROCESS FOR CIRCUIT BOARD

CROSS-REFERENCE TO RELATED APPLICATION

This application claims the priority benefit of Taiwan application serial no. 97103477, filed Jan. 30, 2008. The entirety of the above-mentioned patent application is hereby incorporated by reference herein and made a part of specification.

BACKGROUND OF THE INVENTION

1. Field of the Invention

The present invention relates to a process of a circuit board, and in particularly, relates to a surface treatment process for a circuit board.

2. Description of Related Art

In recent years, along with the progressive development of electronic technology and improvement of high-tech electronic industries, more humanistic electronic products with better functions are continuously put forward and progress towards "light, thin, short, and small." Under such a trend, circuit boards having advantages of closed wiring, compact assembly, and good performance have become a main medium for carrying and electrically connecting a plurality of electronic components, in which the electronic components may be chips.

A flip-chip assembly is one of the methods for assembling a chip and a circuit board. The circuit board has a plurality of pads, and may be electrically and structurally connected to a chip by means of reflow of solder on the pads. In recent years, since more and more signals need be transmitted between electronic components (e.g. chips), the circuit board needs more pads. However, the circuit board has a limited space, so the pitch between the pads is developed towards the fine pitch.

FIG. 1 is a cross-sectional view of a conventional circuit board. Referring to FIG. 1, in the conventional art, usually, an oxidation protection layer 120 is formed on pads 112 of a circuit layer 110 of a circuit board 100 by electroplating. Subsequently, the black oxidation process is performed to form a black oxide layer 140 on the circuit layer 110 exposed by a solder mask layer 130 and the oxidation protection layer 120, so as to achieve the solder protection effects. The thickness of the oxidation protection layer 120 is in a range of 5 µm to 7 µm, and the thickness of the black oxide layer 140 is in a range of 1 µm to 3 µm. Therefore, the oxidation protection layer 120 protrudes from a surface 142 of the black oxide layer 140. Then, the solder (not shown) is disposed on the pads 112, and the circuit board 100 and the chip (not shown) are electrically and structurally connected by means of reflow of the solder (or flux) therebetween. However, when the solder is disposed on the pads 112 and bonded with the chip by means of reflow, the solder may be melted by heat and extruded by the protruding oxidation protection layer 120 and the chip, thus overflowing to the adjacent pads 112 to cause the short circuit of the pads 112.

SUMMARY OF THE INVENTION

The present invention is directed to a surface treatment process for a circuit board, which may prevent the overflow of the melted solder under heat into the adjacent pads to cause the short circuit therebetween when a circuit board and an electronic element are bonded by means of reflow.

The present invention provides a surface treatment process for a circuit board. The circuit board includes a substrate, a first circuit layer, and a second circuit layer. The substrate has a first surface and a second surface reverse to the first surface. The first circuit layer is disposed on the first surface, the second circuit layer is disposed on the second surface, and the first circuit layer and the second circuit layer are electrically connected. The surface treatment process for a circuit board includes the following steps. First, a first solder mask layer and a second solder mask layer are respectively formed on the first surface and the second surface of the substrate. The first solder mask layer includes at least one first opening to expose a portion of the first surface, and the second solder mask layer includes a plurality of second openings to expose at least a portion of the second circuit layer. Then, a cover layer is formed on the first surface in the first opening. The cover layer has a plurality of third openings to expose a portion of the first circuit layer. Subsequently, a first oxidation protection layer is plated on the first circuit layer in the third opening and a second oxidation protection layer is plated on the second circuit layer in the second opening by immersion. Afterwards, the cover layer is removed. Then, a black oxidation process is performed on the first circuit layer exposed by the first oxidation protection layer, so as to form a black oxide layer. The thickness of the first oxidation protection layer is thinner than or equal to the thickness of the black oxide layer.

In an embodiment of the present invention, a thickness of the black oxide layer is in a range of 1 µm to 3 µm.

In an embodiment of the present invention, a thickness of the first oxidation protection layer is in a range of 1 µm to 2 µm.

In an embodiment of the present invention, a material of the cover layer includes a photosensitive material.

In an embodiment of the present invention, the photosensitive material includes a dry film photoresist.

In an embodiment of the present invention, a material of the first oxidation protection layer or the second oxidation protection layer includes tin, immersion nickel/gold, or silver.

In an embodiment of the present invention, the material of the first oxidation protection layer is the same as that of the second oxidation protection layer.

In view of the above, since in the surface treatment process for a circuit board provided by the present invention, the first oxidation protection layer is formed by immersion, the thickness of the first oxidation protection layer may be thinner than or equal to the thickness of the black oxide layer.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
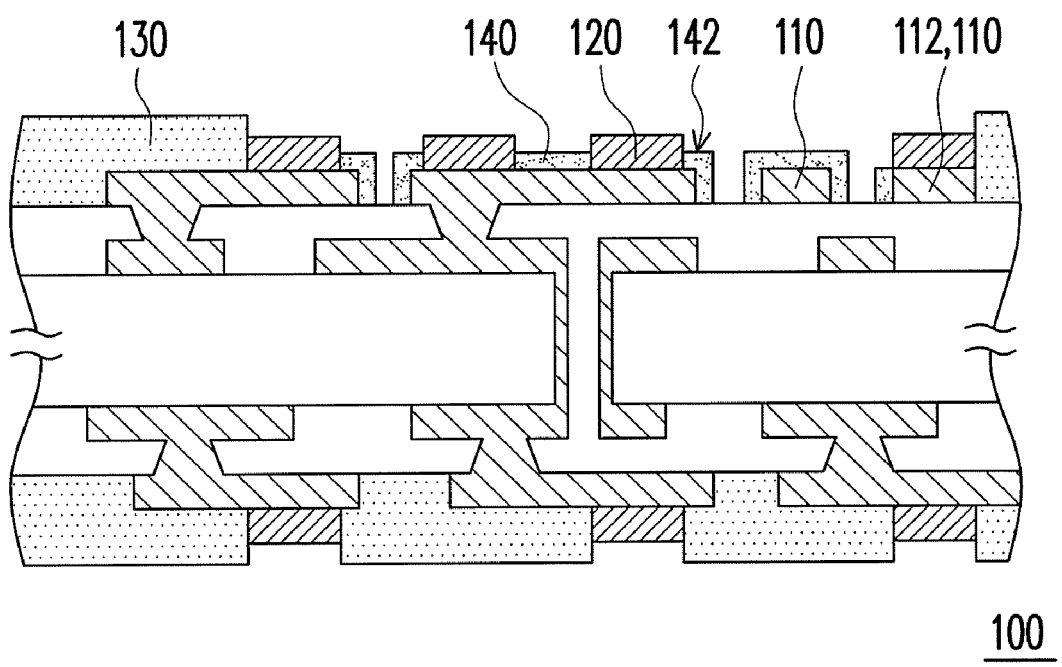
FIG. 1 is a cross-sectional view of a conventional circuit board.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A to 2F show a surface treatment process for a circuit board according to an embodiment of the present invention. First, referring to FIG. 2A, the circuit board 200 includes a substrate 210, a first circuit layer 220, and a second circuit layer 230. The substrate 210 includes a first surface 212 and a second surface 214, and the first surface 212 is reverse to the second surface 214. The first circuit layer 220 is disposed on the first surface 212, and the second circuit layer 230 is disposed on the second surface 214. The first circuit layer 220 and the second circuit layer 230 are electrically connected. The substrate 210 may be a substrate, i.e. a resin substrate, without a circuit layer, and may also be a monolayered circuit board or a multilayered circuit board.

Figure 2A:
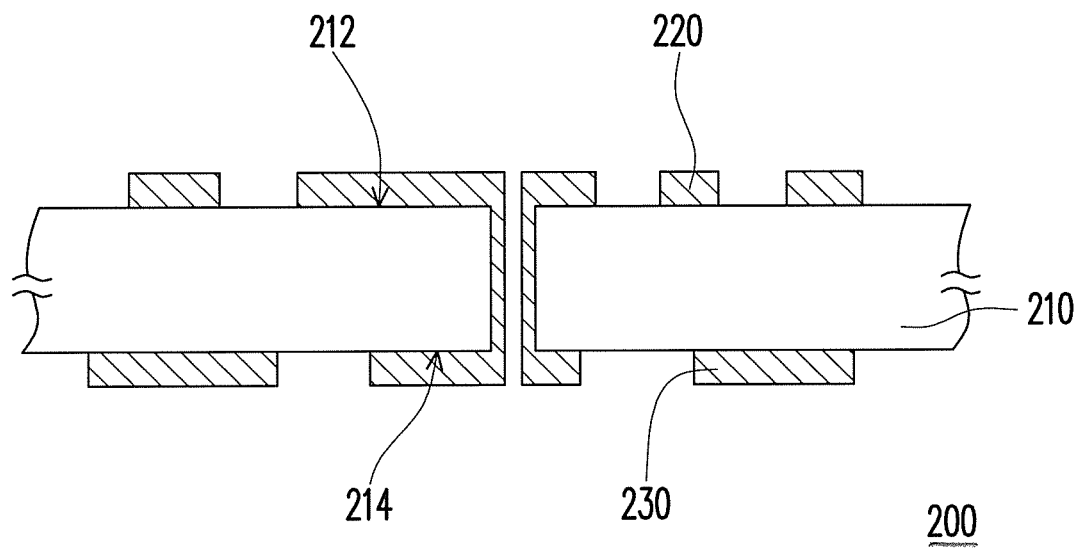
FIGS. 2A to 2F show a surface treatment process for a circuit board according to an embodiment of the present invention.
Figure 2B:
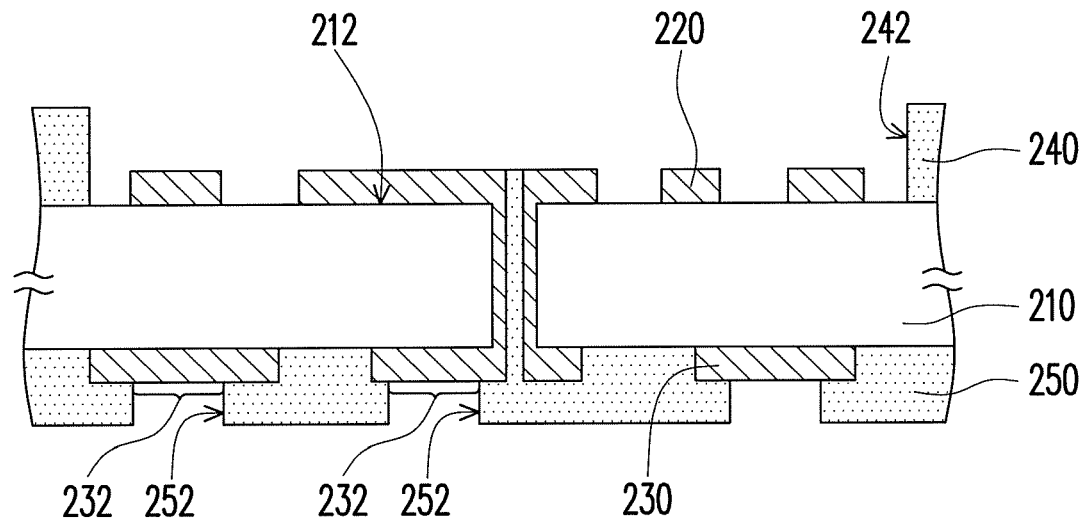

Then, referring to FIG. 2B, a first solder mask layer 240 and a second solder mask layer 250 are respectively formed on the first surface 212 and the second surface 214. The first solder mask layer 240 includes at least one first opening 242, and the first opening 242 exposes a portion of the first surface 212. Furthermore, the second solder mask layer 250 has a plurality of second openings 252, and the second openings 252 expose at least a portion of the second circuit layer 230. It should be noted that the second openings 252 may expose pads 232 of the second circuit layer 230.

Figure 2C:
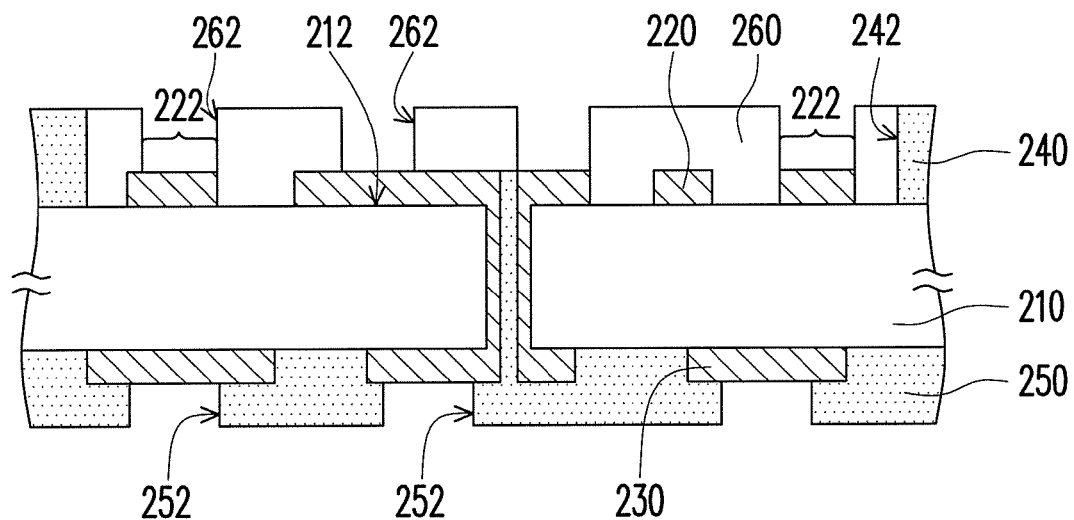

Referring to FIG. 2C, a cover layer 260 is formed on the first surface 212 in the first opening 242. The cover layer 260 includes a plurality of third openings 262, and the third openings 262 expose a portion of the first circuit layer 220. It should be noted that the third openings 262 may expose pads 222 of the first circuit layer 220. The material of the cover layer 260 is, for example, a photosensitive material. Furthermore, the photosensitive material may be a dry film photoresist or a liquid photoresist. Since the cover layer 260 will be removed after the subsequent immersion process, the material is preferably a peelable film. The viscosity of the peelable film is reduced under heat or light irradiation.

Figure 2D:
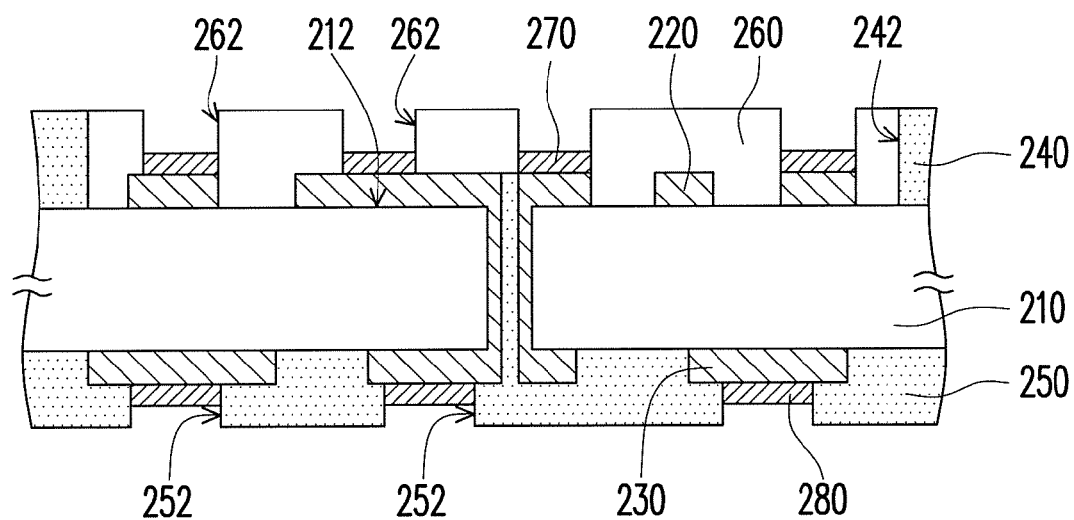

Subsequently, referring to FIG. 2D, the first oxidation protection layer 270 is plated on the first circuit layer 220 in the third opening 262 and the second oxidation protection layer 280 is plated on the second circuit layer 230 in the second opening 252 by immersion. The material of the first oxidation protection layer 270 or the second oxidation protection layer 280 is, for example, tin, immersion nickel/gold, silver, or another suitable anti-oxidation material. Furthermore, the material of the first oxidation protection layer 270 may be the same as that of the second oxidation protection layer 280.

Figure 2E:
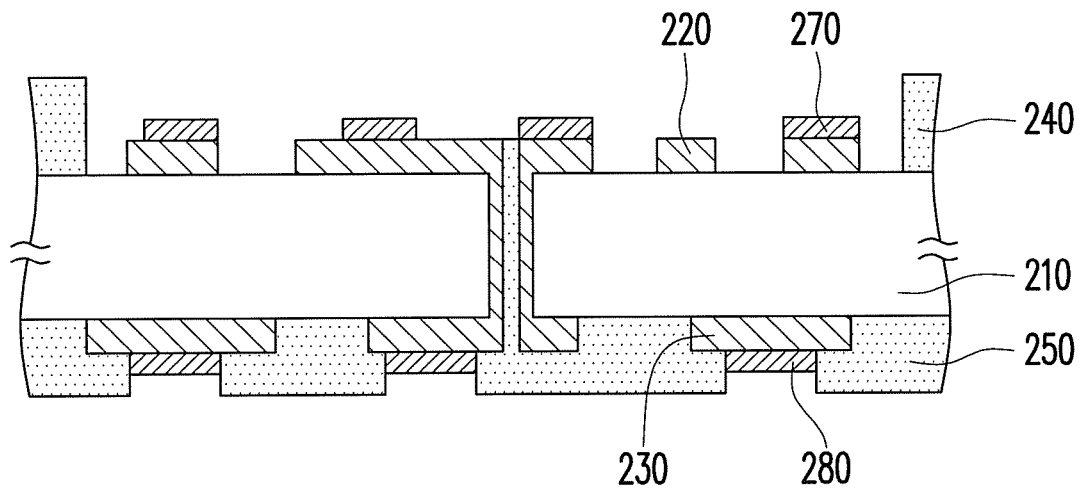
Figure 2F:
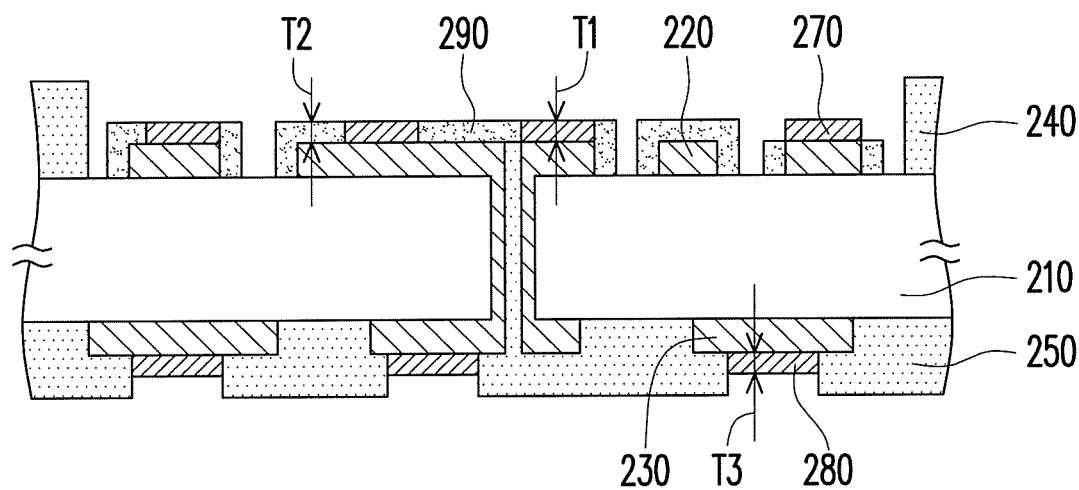

Subsequently, referring to FIG. 2E, the cover layer 260 is removed. Next, referring to FIG. 2F, a black oxidation process is performed on the first circuit layer 220 exposed by the first oxidation protection layer 270, so as to form a black oxide layer 290, and the thickness T1 of the first oxidation protection layer 270 is thinner than or equal to the thickness T2 of the black oxide layer 290. The thickness T1 of the first oxidation protection layer 270 is, for example, in a range of 1 µm to 2 µm. The thickness T2 of the black oxide layer 290 is, for example, in a range of 1 µm to 3 µm. In this embodiment, the black oxidation refers to that the surface of the first circuit layer 220 is lightly oxidized. That is, a copper circuit is immersed in an alkaline oxidation solution, for example, an alkaline sodium chlorite solution, such that the copper circuit is oxidized to form pin-shaped copper oxide surface. Furthermore, the thickness T3 of the second oxidation protection layer 280 is, for example, in a range of 1 µm to 2 µm.

The circuit board 200 of the present invention is bonded with a chip (not shown) by means of reflow of solder (not shown) on the pads 222. Furthermore, the thickness T1 of the first oxidation protection layer 270 is thinner than or equal to the thickness T2 of the black oxide layer 290. Therefore, the solder melted by heat will not be easily extruded by the chip and the first oxidation protection layer 270 to overflow to adjacent pads 222.

In view of the above, in the present application, since the thickness of the first oxidation protection layer formed by the surface treatment process for the circuit board is thinner than or equal to the thickness of the black oxide layer, the probability that the solder melted by heat is extruded by the chip and the first oxidation protection layer may be reduced when the circuit board and the chip are bonded by means of reflow. Therefore, the solder melted by heat may also be prevented from overflowing to adjacent pads to cause the short circuit between the pads.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A surface treatment process for a circuit board, in which the circuit board comprises a substrate, a first circuit layer, and a second circuit layer, wherein the substrate comprises a first surface and a second surface reverse to the first surface, the first circuit layer is disposed on the first surface, the second circuit layer is disposed on the second surface, and the first circuit layer and the second circuit layer are electrically connected, the surface treatment process for a circuit board comprising:

forming a first solder mask layer and a second solder mask layer respectively on the first surface and the second surface of the substrate, wherein the first solder mask layer comprises at least one first opening to expose a portion of the first surface, and the second solder mask layer comprises a plurality of second openings to expose at least a portion of the second circuit layer;

forming a cover layer on the first surface in the first opening, wherein the cover layer comprises a plurality of third openings to expose a portion of the first circuit layer;

plating a first oxidation protection layer on the first circuit layer in the third opening and plating a second oxidation protection layer on the second circuit layer in the second openings by immersion;

removing the cover layer; and performing a black oxidation process on the first circuit layer exposed by the first oxidation protection layer to form a black oxide layer, wherein a thickness of the first oxidation protection layer is thinner than or equal to a thickness of the black oxide layer.

2. The surface treatment process for a circuit board as claimed in claim 1, wherein the thickness of the black oxide layer is in a range of 1 µm to 3 µm.

3. The surface treatment process for a circuit board as claimed in claim 1, wherein the thickness of the first oxidation protection layer is in a range of 1 µm to 2 µm.

4. The surface treatment process for a circuit board as claimed in claim 1, wherein a material of the cover layer comprises a photosensitive material.

5. The surface treatment process for a circuit board as claimed in claim 4, wherein the photosensitive material comprises a dry film photoresist.

6. The surface treatment process for a circuit board as claimed in claim 1, wherein a material of the first oxidation protection layer or the second oxidation protection layer comprises tin, immersion nickel/gold or silver.

7. The surface treatment process for a circuit board as claimed in claim 1, wherein a material of the first oxidation protection layer is the same as that of the second oxidation protection layer.

* * * * *